US010818695B2

(12) United States Patent
Zhang et al.

(10) Patent No.: US 10,818,695 B2
(45) Date of Patent: Oct. 27, 2020

(54) ANTI-REFLECTIVE SUBSTRATE AND METHOD FOR PREPARING THE SAME, ARRAY SUBSTRATE AND DISPLAY DEVICE

(71) Applicants: BOE TECHNOLOGY GROUP CO., LTD., Beijing (CN); Hefei Xinsheng Optoelectronics Technology Co., Ltd., Hefei, Anhui (CN)

(72) Inventors: Donghui Zhang, Beijing (CN); Jing Li, Beijing (CN); Xiaoye Ma, Beijing (CN); Haifeng Liu, Beijing (CN)

(73) Assignees: BOE TECHNOLOGY GROUP CO., LTD., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 16/180,927

(22) Filed: Nov. 5, 2018

(65) Prior Publication Data
US 2019/0273098 A1    Sep. 5, 2019

(30) Foreign Application Priority Data

Mar. 2, 2018  (CN) .......................... 2018 1 0174956

(51) Int. Cl.
*H01L 27/12* (2006.01)
*G02B 1/115* (2015.01)
*H01L 21/027* (2006.01)

(52) U.S. Cl.
CPC .......... *H01L 27/1218* (2013.01); *G02B 1/115* (2013.01); *H01L 21/0276* (2013.01);
(Continued)

(58) Field of Classification Search
CPC ................ H01L 27/1218; H01L 27/124; H01L 27/1262; H01L 27/1288; H01L 27/1214;
(Continued)

(56) References Cited

U.S. PATENT DOCUMENTS 3,973,994 A  *  8/1976  Redfield ................ H01L 31/056
                                                         136/259
5,080,725 A  *  1/1992  Green ................ H01L 31/02363
                                                         136/256
(Continued)

FOREIGN PATENT DOCUMENTS

CN          101097403 A      1/2008
CN          204991722 U      1/2016
(Continued)

OTHER PUBLICATIONS

First Office Action for Chinese Patent Application No. 201810174956.1 dated Jun. 30, 2020.

*Primary Examiner* — Dao H Nguyen
(74) *Attorney, Agent, or Firm* — Thomas | Horstemeyer LLP (57) ABSTRACT

The present disclosure provides an anti-reflective substrate and a method for preparing the same, an array substrate, and a display device. The anti-reflective substrate includes a base substrate and an anti-reflective film having an optical path control structure. The anti-reflective film is disposed on the base substrate, and the optical path control structure is configured to reduce a reflection of an incident light from a side of the base substrate on which the anti-reflective film is disposed.

14 Claims, 5 Drawing Sheets

(52) U.S. Cl.
CPC ........ *H01L 27/124* (2013.01); *H01L 27/1262* (2013.01); *H01L 27/1288* (2013.01)

(58) Field of Classification Search
CPC ....... H01L 21/0276; G02B 1/115; G02B 1/11; G02B 5/201; G02F 1/136286; G02F 1/133502; G02F 1/1335; G02F 1/136209
USPC .......... 257/51, 72, 79, 88, 98, 432, E21.089, 257/E21.029, E21.53, E21.538, E33.068, 257/E33.074, E31.13, E31.127, E31.042, 257/E31.043; 349/137, 159, 65, 96; 359/290, 291, 454; 438/27, 29, 72, 89
See application file for complete search history.

(56) References Cited

U.S. PATENT DOCUMENTS

| | | | | | |
|---|---|---|---|---|---|
| 5,261,970 | A | * | 11/1993 | Landis | ................ H01L 31/0236 136/252 |
| 6,294,723 | B2 | * | 9/2001 | Uematsu | ............. H01L 31/0236 136/246 |
| 7,238,878 | B2 | * | 7/2007 | Gonsiorawski | ..... B32B 17/1033 136/244 |
| 7,659,669 | B2 | * | 2/2010 | Nishida | .................... H01J 11/12 313/495 |
| 8,039,731 | B2 | * | 10/2011 | Durvasula | ........... H01L 31/0547 136/246 |
| 10,310,144 | B2 | * | 6/2019 | Ahmed | ................... G02B 1/118 |
| 2008/0042926 | A1 | * | 2/2008 | Egi | ........................ C09K 11/06 345/32 |
| 2008/0129933 | A1 | * | 6/2008 | Nishida | .................. G02B 1/118 349/96 |
| 2015/0165733 | A1 | * | 6/2015 | Takihara | ................ B32B 27/16 428/141 |
| 2016/0370505 | A1 | * | 12/2016 | Koo | ........................ G02B 1/118 |

FOREIGN PATENT DOCUMENTS

| | | |
|---|---|---|
| CN | 105304648 A | 2/2016 |
| CN | 105866999 A | 8/2016 |
| CN | 107272250 A | 10/2017 |

* cited by examiner

ANTI-REFLECTIVE SUBSTRATE AND METHOD FOR PREPARING THE SAME, ARRAY SUBSTRATE AND DISPLAY DEVICE

CROSS-REFERENCE TO RELATED APPLICATIONS

This disclosure claims priority to Chinese Patent Application No. 201810174956.1, filed on Mar. 2, 2018, the entire contents of which are incorporated herein be reference.

TECHNICAL FIELD

The present disclosure relates to the field of display technology, and particularly, to an anti-reflective substrate and a method for preparing the same, an array substrate and a display device.

BACKGROUND

LCD (Liquid Crystal Display) includes an array substrate and a color filter substrate provided as a paired box. In ordinary LCDs, the color filter substrate is usually arranged on the ambient light side, and the array substrate is usually arranged on the backlight side. This allows the incident ambient light to be first exposed to RGB photoresist or BM (Black Matrix). The emission of light reflected by the photoresist or BM has less influence on the user's viewing experience. However, in the LCDs based on some special requirements, the array substrate is arranged on the ambient light side, and the color filter substrate is arranged on the backlight side. As a result, the gate metal layer and the source/drain metal layer directly face the user, so the reflection of ambient light is strong, which has a great impact on the user's viewing experience. In view of this, the design of an anti-reflective film usually becomes an important consideration for this structure.

SUMMARY OF THE DISCLOSURE

In one aspect, the present disclosure provides an anti-reflective substrate, including a base substrate and an anti-reflective film, in which the anti-reflective film is provided on the base substrate and includes an optical path control structure configured to reduce the reflection of incident light from the side of the base substrate away from the anti-reflective film.

According to one arrangement of the present disclosure, the anti-reflective film has a multi-layered structure that includes a first film, and a second film. The second film is disposed on a side of the first film away from the base substrate. The multi-layered structure includes an optical path control structure including a convex portion formed by patterning the first film and a concave portion formed by patterning the second film. The convex surface of the convex portion and the concave surface of the concave portion fit together, and twice of the angle between the bottom surface and the side surface of the convex portion is substantially larger than the critical angel of the light emitted from the base substrate towards the air.

According to one arrangement of the present disclosure, the convex portion and the concave portion are pyramid structures.

According to one arrangement of the present disclosure, the first film includes a silicon nitride film, and the second film includes an amorphous silicon film.

According to one arrangement of present disclosure, the anti-reflective film includes a structure composed of a third film, and the optical path control structure includes a micro structure formed by patterning the third film.

According to one arrangement of the present disclosure, the third film includes an amorphous silicon film.

In one aspect, the present disclosure provides a method for preparing an anti-reflective substrate includes forming an anti-reflective film on a base substrate and patterning the anti-reflective film to obtain an optical path control structure. The optical path control structure is configured to reduce the reflection of incident light from the side of the base substrate with the anti-reflective film.

According to one arrangement of the present disclosure, the method further includes forming a first film on the base substrate and patterning the first film to obtain a first film structure having convex portions, and forming a second film on the first film structure and patterning the second film to obtain a second film structure having concave portions. Twice of the angle between the bottom surface and the side surface of the convex portion is substantially larger than the critical angle of light emitted from the base substrate towards the air.

According to one arrangement of the present disclosure, the process of patterning the first film includes applying a first photoresist on the first film, allowing the first photoresist to be subjected to exposing and developing by a continuous half exposing mask process, and then etching the first film under the first photoresist, so as to obtain a first film structure having convex portions. The process of patterning the second film includes applying a second photoresist over the second film, allowing the second photoresist to be subjected to exposing and developing by a half exposing mask process, and then etching the second film under the second photoresist, so as to obtain a second film structure having concave portions. One of the first photoresist and the second photoresist is a positive photoresist and the other is a negative photoresist.

According to one arrangement of the present disclosure, the convex portion and the concave portion are pyramid structures.

According to one arrangement of the present disclosure, the first film includes a silicon nitride film, and the second film includes an amorphous silicon film.

According to one arrangement of the present disclosure, the process of forming the anti-reflective film on the base substrate and patterning the film to obtain the optical path control structure comprises: forming a third film on the base substrate and patterning the third film to obtain a third film structure composed of micro structures.

According to one arrangement of the present disclosure, the third film includes an amorphous silicon film.

In one aspect, the present disclosure provides an array substrate, including the anti-reflective substrate as described above, and a pixel structure disposed on the side of the base substrate with the anti-reflective substrate.

According to one arrangement of the present disclosure, the pixel structure includes a plurality of scan lines and data lines arranged in rows and columns, thin film transistors in the regions defined by adjacent scan lines and adjacent data lines, and pixel electrodes electrically connected to the thin film transistors. The orthographic projection of the anti-reflective film on the base substrate substantially covers the orthographic projections of the scan lines, the data lines and the thin film transistors on the base substrate, but does not fully cover the orthographic projections of the pixel electrodes on the base substrate.

According to one arrangement of the present disclosure, the array substrate further includes a planar layer between the anti-reflective film and the pixel structure.

In one aspect, the present disclosure provides a display device, including the above array substrate located on the side of ambient light and a paired box substrate.

BRIEF DESCRIPTION OF THE DRAWINGS

The drawings, which are incorporated in the specification and become a part thereof, are intended to illustrate the arrangements and interpret the principles of the present disclosure. It is obvious that the following drawings are only illustrative to some arrangements of the present disclosure. For those ordinary skilled in the art, other drawings can be obtained based on these drawings without any creative work.

DETAILED DESCRIPTION

The arrangements will now be described more fully with reference to the drawings. However, the arrangements can be implemented in a variety of ways and should not be construed as being limited to the examples set forth herein. Rather, these arrangements are provided so that this disclosure will be more comprehensive and complete, and the concept of the arrangements is fully conveyed to those skilled in the art. The described features, structures, or characteristics may be combined in any suitable manner in one or more arrangements.

In addition, the drawings are merely schematic representations of the present disclosure and are not necessarily to scale. The same reference numerals in the drawings denote the same or similar parts, and the repeated description thereof will be omitted.

In the prior art, the anti-reflective film such as ITO (Indium Tin Oxide) is usually configured as a whole layer on the side of the gate metal layer facing the base substrate, to reduce the reflection of the ambient light. However, the anti-reflective film configured as a whole layer has a great adverse effect on the transmittance of the display screen, which may cause the power of the backlight to increase and accordingly cause the power consumption of the product to increase.

In one arrangement, the present disclosure provides an anti-reflective substrate, including a base substrate 01 and an anti-reflective film 10. The anti-reflective substrate can be applied to a display device in which an array substrate is located on the ambient light side and a color filter substrate is located on the backlight side, to reduce the reflection of the ambient light by the metal layer on the array substrate. The anti-reflective film can be configured on the base substrate 01 of the array substrate corresponding to the area with a metal layer such as a scan line, a data line, and a thin film transistor.

Figure 1:
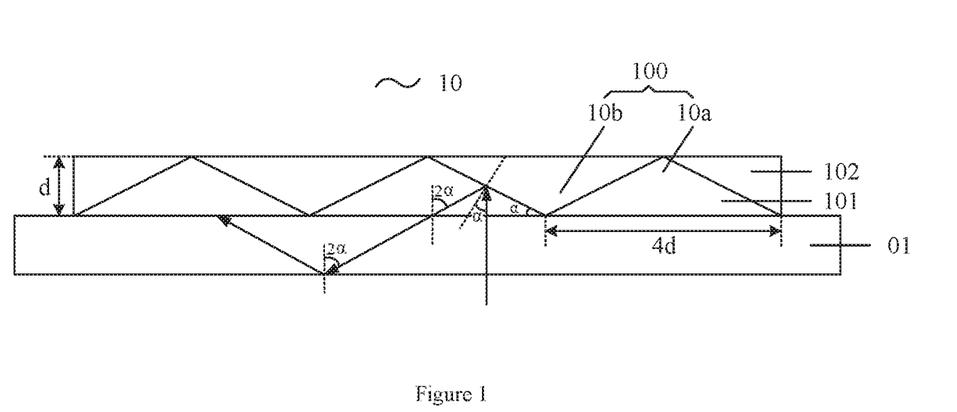
FIG. 1 is a schematic view illustrating a cross-sectional structure of an anti-reflective film according to one arrangement of the present disclosure.
Figure 2:
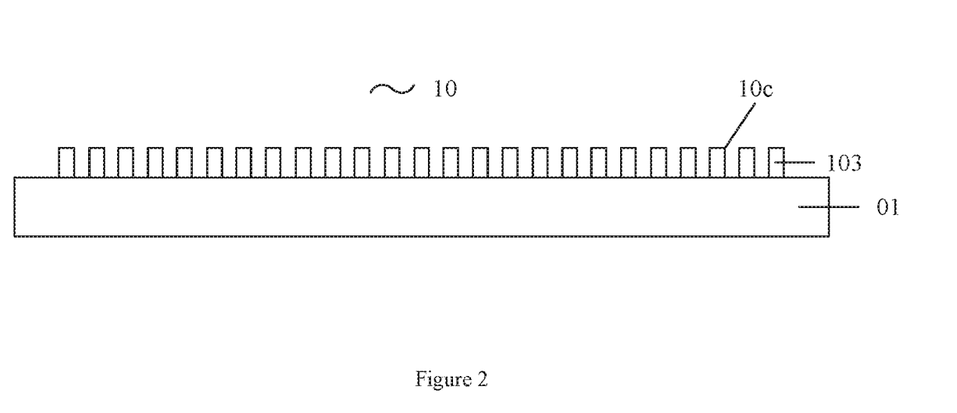
FIG. 2 is a schematic view illustrating a cross-sectional structure of an anti-reflective film according to another arrangement of the present disclosure.

As shown in FIG. 1 and FIG. 2, the anti-reflective film 10 may include a film bulk including an optical path control structure 100 formed by a process of patterning; wherein the anti-reflective film 10 is disposed on the base substrate 01 which is located between the anti-reflective film 10 and the air, the optical path control structure 100 is configured to allow the incident light such as ambient light to be totally reflected at the interface between the base substrate 01 and the medium of air, and consequently the incident light cannot exit from the side of the base substrate 01.

It should be noted that the optical path control structure 100 according to this arrangement can make the incident ambient light to be limited inside the base substrate 01 and not to be emitted, and can be a micro structure totally reflecting the light. The micro structure, the actual shape of which is not limited herein, for example, can be a concave structure or a nanotube structure.

In the anti-reflective film 10 according to one arrangement of the present disclosure, the film bulk is provided with the optical path control structure 100 which allows the light to be totally reflected at the interface between the base substrate 01 and the medium of air, so that the incident ambient light is limited inside the base substrate 01 and cannot be emitted, which can effectively reduce the reflection of the ambient light by the display device, and consequently can ensure that the user's viewing experience is not affected but improved. Therefore, when the anti-reflective film 10 is applied to the array substrate, it can be only disposed corresponding to the region with the metal on the array substrate, so that the transmittance of the display region is not affected, and accordingly the low power consumption performance of the display product can be ensured.

In one arrangement, as shown in FIG. 1, the film bulk has a multi-layer structure composed of the first film 101 and the second film 102, and the second film 102 is disposed on the side of the first film 101 away from the base substrate 01. In this case, the optical path control structure 100 includes the convex portion 10a formed by patterning the first film 101 and the concave portion 10b formed by patterning the second film 102, and the convex surface of the convex portion 10a and the concave surface of the concave portion 10b fit together, so as to form an entire optical path control structure. Furthermore, twice of the angle between the bottom surface and the side surface of the convex portion 10a is substantially larger than the critical angel of the light emitted from the base substrate 01 towards the air, thus satisfying the total reflection condition of the light at the interface between the base substrate 01 and the air.

The first film 101 can be a silicon nitride film, and the second film 102 can be an amorphous silicon film. Accordingly, the concave portion 10b made of amorphous silicon can absorb and reflect the ambient light, and thus the reflection of the ambient light can be reduced. However, it should be noted that other semiconductor materials that absorb visible light may also be used in this arrangement, which is not limited herein.

It should be noted that when the side surface of the convex portion 10a is a flat surface, the angle between the bottom surface and the side surface of the convex portion 10a is defined as the angle between the bottom surface and the flat surface; when the side surface of the convex portion 10a is a curved surface, the angle between the bottom surface and the side surface of the convex portion 10a is defined as the angle between the tangent of the curved side corresponding to the curved surface and bottom side corresponding to the bottom surface in the cross-sectional view perpendicular to the bottom surface. Further, both the convex portion 10a and the concave portion 10b described herein are based on the base substrate 01, that is, appearing in a convex shape or a concave shape with respect to the base substrate 01.

In this arrangement, the convex portion 10a and the concave portion 10b may each have a pyramid structure such as a triangular pyramid or a rectangular pyramid. In this case, the convex portion 10a is a pyramidal convex portion, and the concave portion 10b is a pyramidal concave portion. Accordingly, the side surface of the convex portion 10a is a flat structure, and the angle between the bottom surface and the side surface of the convex portion 10a is defined as the angle between the two planes, which is easier to be controlled compared with the angle between a plane and a curved surface. In one arrangement, the pyramid structure can be a regular pyramid structure, and accordingly the angle between each side surface and the bottom surface of the convex portion 10a is equal, so that the total reflection condition of each side of the pyramid structure can be satisfied at the same time by a reasonable design.

The principle of total reflection in this arrangement will be exemplarily described below with reference to FIG. 1. As shown in the figure, the base length of the pyramidal convex portion is indicated as nd, and the height of the pyramidal convex portion is indicated as d. The slope angle α of the pyramidal convex portion can be controlled by appropriately setting the ratio n of the base length to the height. For example, the slope angle α=26.6°, when n is 4.

Based on this, when the ambient light is perpendicularly incident on the base substrate 01, it passes through the base substrate 01 to reach the interface between the convex portion 10a of the first film 101 and the concave portion 10b of the second film 102. Meanwhile, a part of light is absorbed by the second film 102, the other part is reflected at the interface, and the reflected light is returned to the base substrate 01. Based on the principle of reflection and refraction of light, the incident angle of the reflected light reaching the interface between the first film 101 and the base substrate 01 is 2α=53.2°. Since the refractive index of the first film 101 such as the silicon nitride film is less than that of the base substrate 01 such as the glass substrate, the incident angle of the reflected light reaching the interface between the base substrate 01 and the air is greater than about 41°. Consequently, the total reflection occurs at the interface and cannot be emitted (in case that the light is obliquely directed from the glass to the air, when the incident angle reaches about 41°, the total reflection will appear), so that the user's viewing experience will not be affected. It should be understood that the above description is merely illustrative, and the slope angle α of the pyramidal convex portion mentioned in this example may also be greater than 26.6°.

It should be noted that the number and the size of the convex portion 10a and the concave portion 10b in the figure are only illustrative, and can be adjusted according to the actual line width and the process. In practice, by controlling the ratio n of the base length to the height of the pyramidal convex portion, the slope and the inclination of the pyramidal convex portion can be controlled, and thus the emergent angle of the reflected light can be controlled. In this arrangement, when the incident angle of the reflected light at the interface between the base substrate 01 such as glass substrate and the air is substantially larger than 41°, total reflection of the reflected light occurs, and the reflected light is limited inside the screen without any influence on the viewers.

In another arrangement, as shown in FIG. 2, the film bulk includes the structure composed of the third film 103. In this case, the optical path control structure 100 includes the micro structure formed by patterning the third film 103. Due to the small dimension, the micro structure has unique light absorption properties, such as an improved absorption efficiency. The third film 103 can be an amorphous silicon film, and consequently the micro structure can be silicon nanotube. It should be noted that, in this arrangement, other semiconductor materials that absorb visible light may also be used to form the above-mentioned micro structure, which is not limited herein. In this arrangement, ambient light is absorbed and reflected by the micro structure, so that the effect of reducing the ambient light reflection can be achieved.

Based on the arrangements as described above, the anti-reflective film 10 according to the present disclosure may further include a planar layer on the film bulk, such as a silicon nitride film or a silicon oxide film, covering the optical path control structure 100 of the film bulk on the side away from the base substrate 01. Thus, on one hand, the optical path control structure 100 can be protected from damage, and on the other hand, a flat surface can be formed which is useful for the deposition of subsequent layers.

The present disclosure further provides a method for preparing the anti-reflective film 10. The anti-reflective film can be applied to a display device in which an array substrate is located on the ambient light side and a color filter substrate is located on the backlight side, to reduce the reflection of the ambient light by the metal layer on the array substrate. The anti-reflective film 10 can be configured on the base substrate 01 of the array substrate corresponding to the area with a metal layer such as a scan line, a data line, and a thin film transistor.

Accordingly, the method for preparing the anti-reflective film 10 comprises: forming a film bulk on a base substrate 01 and patterning the film bulk, so as to obtain an optical path control structure 100; wherein the base substrate 01 is located between the anti-reflective film 10 and the air, and the optical path control structure 100 allows the incident light to be totally reflected at the interface between the base substrate 01 and the air.

In the method for preparing the anti-reflective film 10 according to the present disclosure, the film bulk is subjected to the process of patterning to form the optical path control structure 100 which allows the light to be totally reflected at the interface between the base substrate 01 and the medium of air, so that the incident ambient light is limited inside the base substrate 01 and cannot be emitted, which can effectively reduce the reflection of the ambient light by the display device, and consequently can ensure that the user's viewing experience is not affected but improved. Therefore, when the anti-reflective film 10 is applied to the array substrate, it can be only disposed corresponding to the region with the metal on the array substrate, so that the transmittance of the display region is not affected, and accordingly the low power consumption performance of the display product can be ensured.

In one arrangement, as shown in FIG. 1, the film bulk has a multi-layered structure composed of the first film 101 and the second film 102, and the optical path control structure 100 includes the convex portion 10a formed by patterning the first film 101 and the concave portion 10b formed by patterning the second film 102. Accordingly, the method for preparing the anti-reflective film 10 comprises the step 101 of forming the first film 101 on the base substrate 01 and patterning the first film 101, so as to obtain a first film structure having convex portions 10a.

Figure 3:
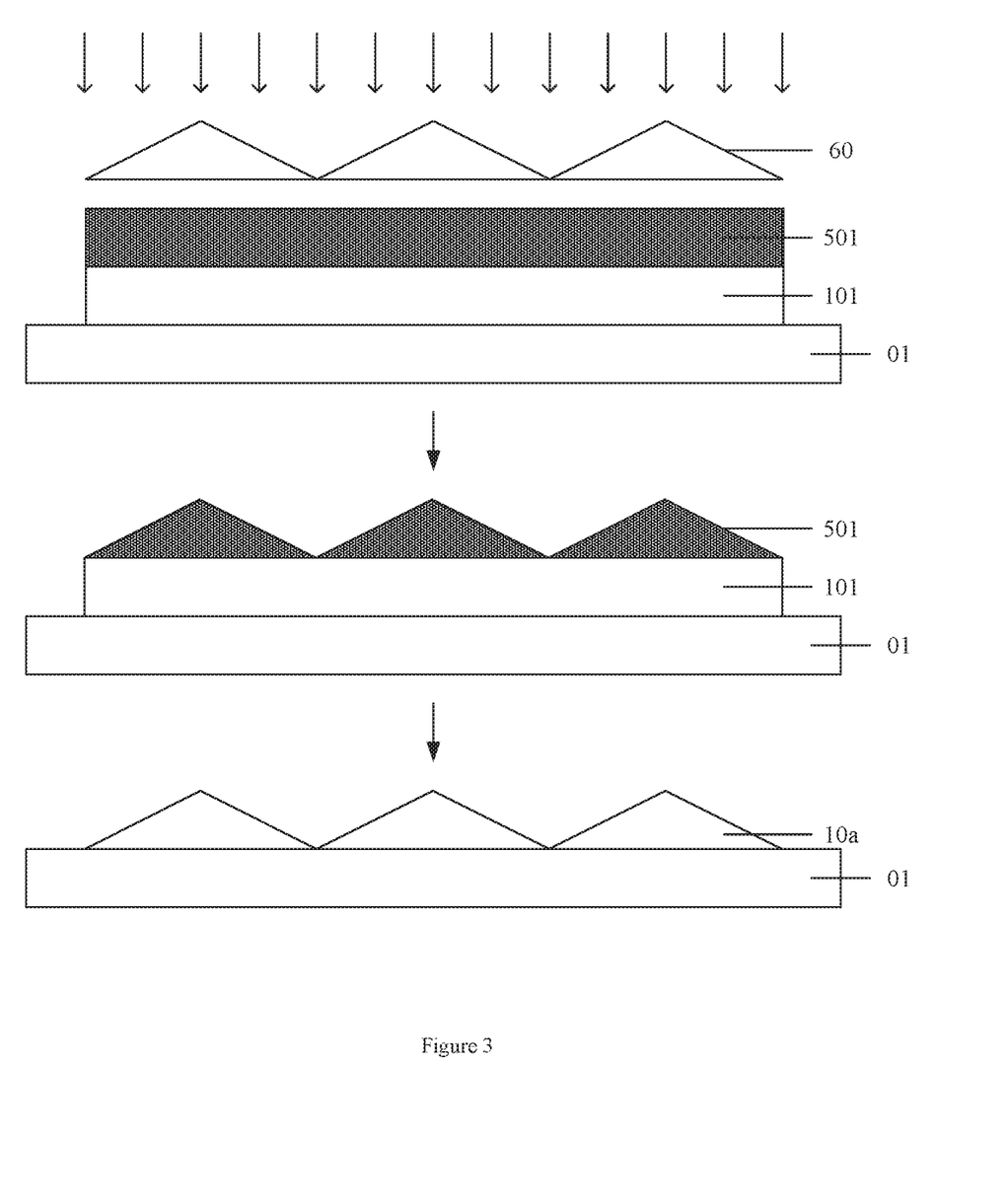
FIG. 3 is a schematic view illustrating a process of patterning to form convex portions according to one arrangement of the present disclosure.

The first film 101 can be a silicon nitride film. As shown in FIG. 3, the process of patterning comprises: applying a first photoresist 501 on the first film 101, allowing the first photoresist 501 to be subjected to exposing and developing by a continuous half exposing mask process with a half exposing mask, and then etching the first film 101 under the first photoresist 501, so as to obtain the first film structure having convex portions 10a.

The method further comprises the step 102 of forming the second film 102 on the first film structure and patterning the second film 102, so as to obtain a second film structure having concave portions 10b.

Figure 4:
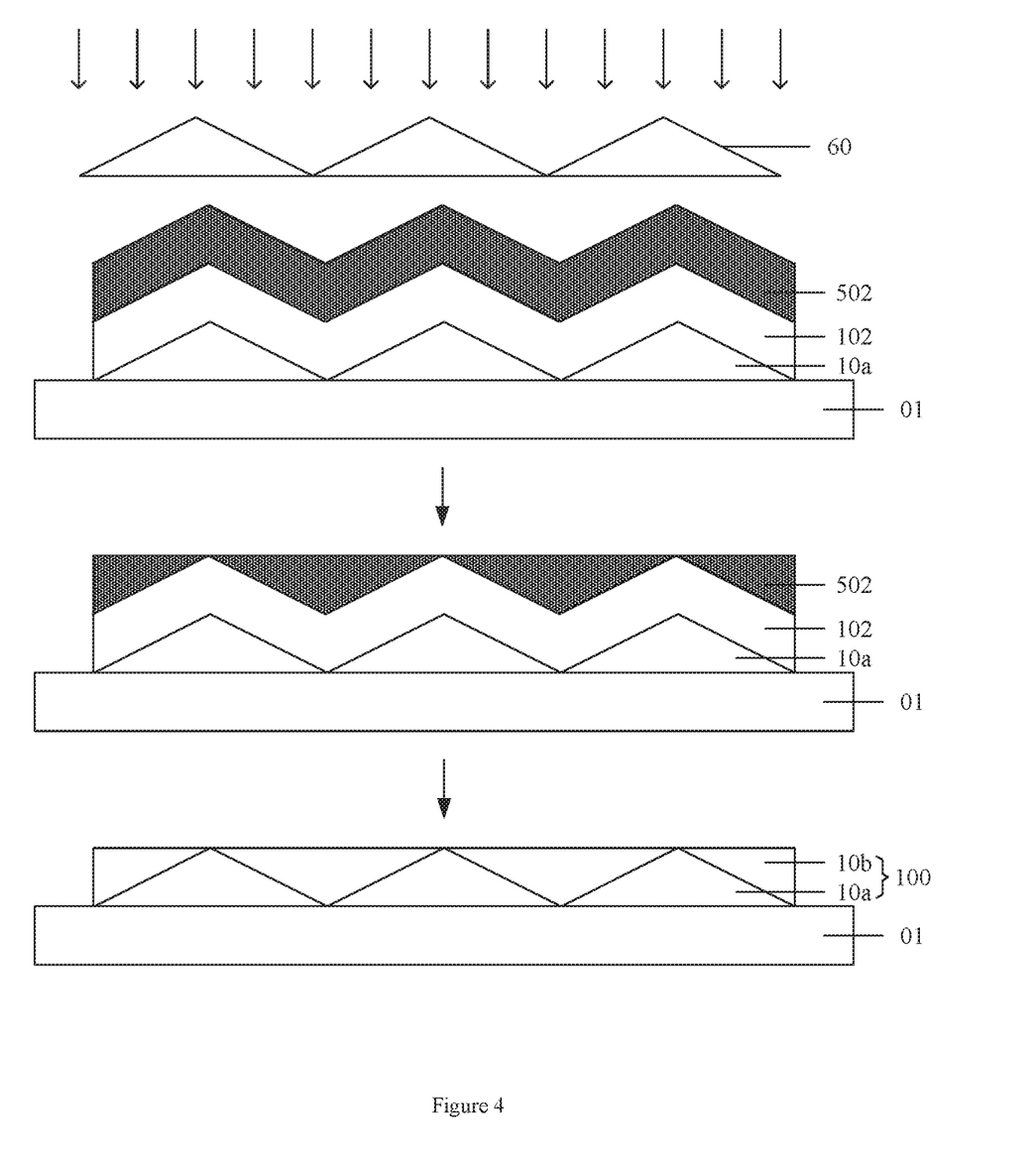
FIG. 4 is a schematic view illustrating a process of patterning to form concave portions according to one arrangement of the present disclosure.

The second film 102 can be an amorphous silicon film. As shown in FIG. 4, the process of patterning comprises: applying a second photoresist 502 on the second film 102, allowing the second photoresist 502 to be subjected to exposing and developing by a continuous half exposing mask process with a half exposing mask 60, and then etching the second film 102 under the second photoresist 502, so as to obtain the second film structure having concave portions 10b.

Twice of the angle between the bottom surface and the side surface of the convex portion 10a formed by the above process should be substantially larger than the critical angle of the light emitted from the base substrate 01 toward the air, to satisfy the total reflection condition of the light at the interface between the base substrate 01 and the air. In view of this, the above steps can be performed by using a reverse etching method in this arrangement. Particularly, the pre-selected part is etched and the remaining part is retained in step 201, and the remaining part is subsequently etched and the etched pre-selected part is protected this time in step 202. As a result, two layers of films having complementary patterns can be formed. Moreover, the side of the second film 102 away from the base substrate 01 is substantially flat, which is useful for the deposition of subsequent layers. Additionally, one of the first photoresist 501 and the second photoresist 502 should be a positive photoresist, and the other should be a negative photoresist, and for economic reasons, the mask used in step 201 and step 202 may be the same, but is not limited thereto.

In this arrangement, the convex portion 10a and the concave portion 10b may each have a pyramid structure such as a triangular pyramid or a rectangular pyramid. In this case, the convex portion 10a is a pyramidal convex portion, and the concave portion 10b is a pyramidal concave portion. Accordingly, the side surface of the convex portion 10a is a flat structure, and the angle between the bottom surface and the side surface of the convex portion 10a is defined as the angle between the two planes, which is easier to be controlled compared with the angle between a plane and a curved surface. In one arrangement, the pyramid structure can be a regular pyramid structure, and accordingly the angle between each side surface and the bottom surface of the convex portion 10a is equal, so that the total reflection condition of each side of the pyramid structure can be satisfied at the same time by a reasonable design.

In another arrangement, as shown in FIG. 2, the film bulk includes a single-layered structure composed of a third film 103, and the optical path control structure 100 includes micro structure 10c. Accordingly, the method for preparing the anti-reflective film 10 comprises the step 200 of forming the third film 103 on the base substrate 01 and patterning the third film 103, so as to obtain a third film structure having a plurality of micro structures 10c.

The third film 103 can be an amorphous silicon film. The process of patterning can be performed by etching the amorphous silicon film with a solution of $AgNO_3$ or the like at an appropriate concentration to obtain a silicon micro structure array.

Based on the arrangements as described above, the method for preparing the anti-reflective film 10 according to the present disclosure may further comprises forming a planar layer such as a silicon nitride film or a silicon oxide film on the film bulk, to cover the optical path control structure 100 of the film bulk. Thus, on one hand, the optical path control structure 100 can be protected from damage, and on the other hand, a flat surface can be formed which is useful for the deposition of subsequent layers. Since the films used in this arrangement are made of common materials such as amorphous silicon or silicon nitride which are widely used in the preparation of the array substrate, the absorption and the reflection of light can be achieved with materials commonly used in the prior art.

Figure 5:
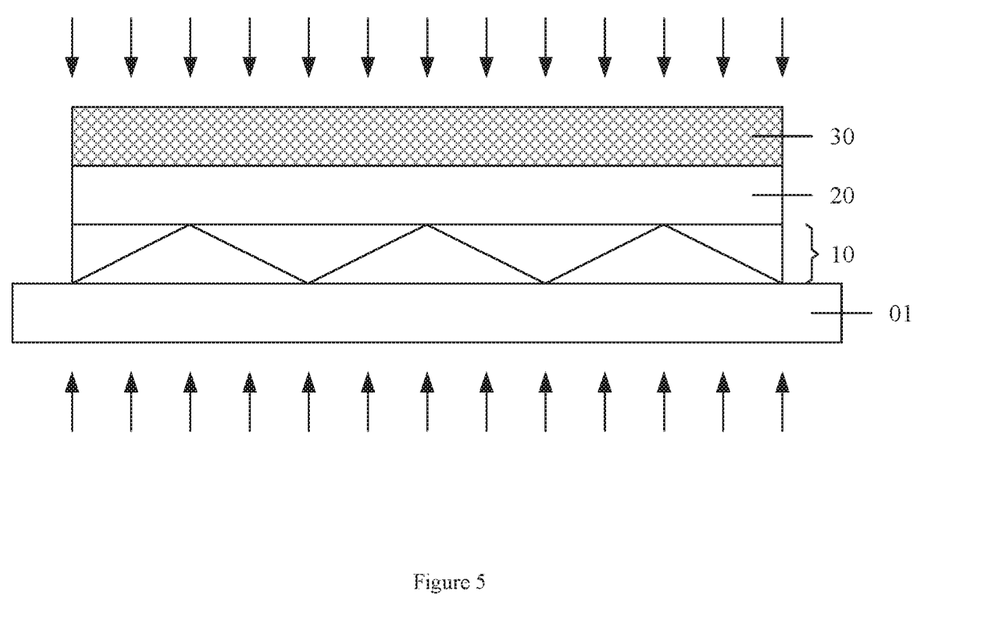
FIG. 5 is a schematic view illustrating a cross-sectional structure of an array substrate according to one arrangement of the present disclosure.
Figure 6:
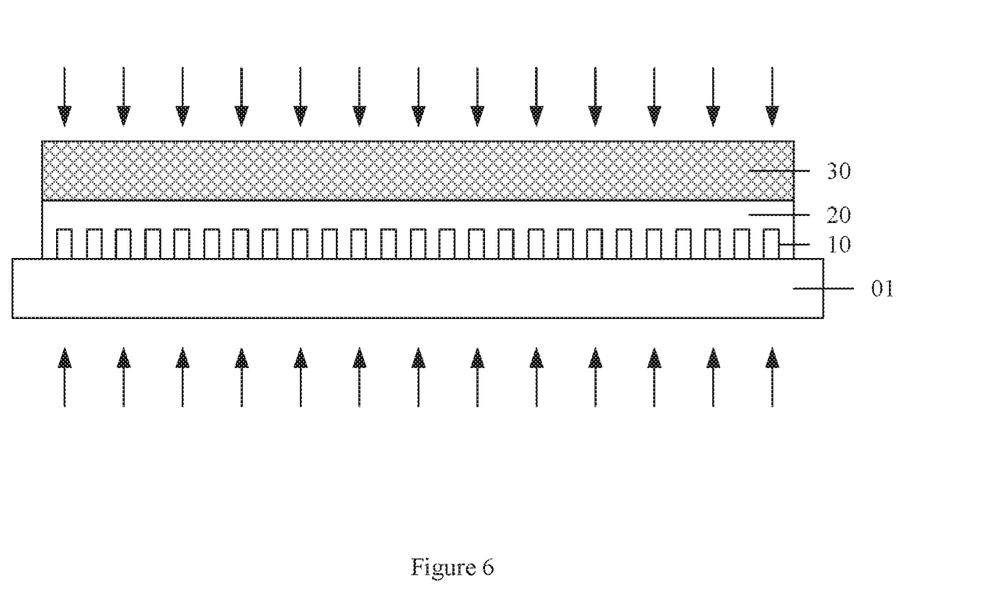
FIG. 6 is a schematic view illustrating a cross-sectional structure of an array substrate according to another arrangement of the present disclosure.

In still another arrangement, the present disclosure further provides an array substrate, as shown in FIG. 5 and FIG. 6, including a base substrate 01, an anti-reflective film 10 disposed on the base substrate 01, a planar layer 20 disposed on the anti-reflective film 10, and a pixel structure 30 disposed on the planar layer 20.

Figure 7:
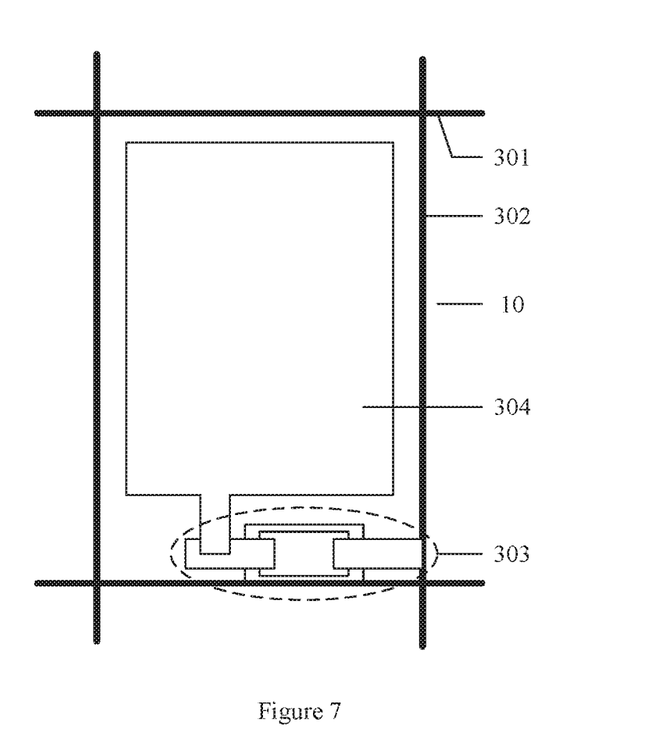
FIG. 7 is a top view illustrating an array substrate according to one arrangement of the present disclosure.

The pixel structure 30 includes a plurality of scan lines 301 and data lines 302 arranged in rows and columns, thin film transistors in the regions defined by adjacent scan lines 301 and adjacent data lines 302, and pixel electrodes 304 electrically connected to the thin film transistors 303. As shown in FIG. 7, the orthographic projection of the anti-reflective film 10 on the base substrate 01 substantially covers the orthographic projections of the scan lines 301, the data lines 302 and the thin film transistors 303 on the base substrate 01, but does not fully cover the orthographic projections of the pixel electrodes 304 on the base substrate 01. In other words, the anti-reflective film 10 can be configured corresponding to the region with a metal layer such as a scan line, a data line, and a thin film transistor.

It should be noted that the anti-reflective film 10 can be disposed corresponding to the region with the metal layer, which is advantageous for obtaining the maximum aperture ratio and the highest transmittance, but does not mean that the anti-reflective film 10 cannot be disposed in other regions. The array substrate to which the anti-reflective film 10 is applied should be considered to fall within the scope of the present disclosure.

Therefore, by forming the anti-reflective film 10 between the pixel structure 30 and the base substrate 01 of the array substrate, the reflection of the ambient light by the display device can be effectively reduced. In one arrangement, the anti-reflective film 10 is disposed only corresponding to the region with the metal layer on the array substrate, which is advantageous for achieving high transmittance and low power consumption.

In still another arrangement, the present disclosure further provides a display device, including the above array substrate on the ambient light side and a paired-box substrate such as a color filter substrate on the backlight module side, which can effectively reduce the reflection of the ambient light caused by the display device and allow the user's viewing experience not to be affected.

The display device may include any product or component having a display function, such as a mobile phone, a tablet computer, a television, a notebook computer, a digital photo frame, a navigator, and the like.

In the anti-reflective film and the method for preparing the same, the array substrate and the display device according to the arrangements of the present disclosure, by forming the optical path control structure on the film bulk, which allows the light to be totally reflected at the interface between the base substrate and the air, the incident ambient light can be limited inside the base substrate and can not be emitted, so that the reflection of the ambient light caused by the display device can be effectively reduced and the user's viewing experience can be improved without any impact accordingly. Based on this, the anti-reflective film can be applied only corresponding to the region with the metal layer on the array substrate, and thus the transmittance of the display region will not be affected and the low power consumption of the display product can be ensured accordingly. It should be noted that although several modules or units of the device for action executing are mentioned in the detailed description above, such division is not mandatory. Indeed, in accordance with arrangements of the present disclosure, the features and functions of two or more modules or units described above can be implemented by a single module or unit. Conversely, the features and functions of one module or unit described above may be further divided and implemented by several modules or units.

In addition, although the steps of the method according to the present disclosure are described in a specific order in the figures, this is not required or implied that the steps must be performed in the specific order or all the steps shown must be performed to achieve the desired result. Additionally or alternatively, certain steps may be omitted, several steps may be combined into one step, and/or one step can be divided into several steps.

By considering the specification and implementing the technical solutions disclosed herein, other arrangements of the present disclosure will be apparent to those skilled in the art. This application is intended to cover any variations, uses, or adaptations of the present disclosure, which are in accordance with the general principles of the present disclosure and include common general knowledge or conventional technical means in the art that are not disclosed herein. The specification and arrangements should be regarded as illustrative only, and the true scope and spirit of the present disclosure is limited by the following claims.

It should be understood that the disclosure is not limited to the structures described above and illustrated in the drawings, and various modifications and changes can be made without departing from the scope of the present disclosure, which is limited only by appended claims.

What is claimed is:

1. An array substrate, comprising an anti-reflective substrate and a pixel structure, wherein
    the anti-reflective substrate comprises a base substrate and an anti-reflective film disposed on a first surface of the base substrate, wherein the anti-reflective film comprises an optical path control structure, and the optical path control structure is configured so that a total internal reflection of light, that enters into the base substrate from a second surface of the base substrate opposite to the first surface and then is reflected by the optical path control structure, occurs at an interface between the second surface of the base substrate and air;
    the pixel structure is disposed on a side of the anti-reflective film away from the base substrate, and comprises a plurality of scan lines and data lines arranged in rows and columns, respectively, thin film transistors in respective regions defined by adjacent scan lines and adjacent data lines, and pixel electrodes electrically connected to the thin film transistors; and
    an orthographic projection of the anti-reflective film on the base substrate covers orthographic projections of the scan lines, the data lines, and the thin film transistors on the base substrate, and exposes orthographic projections of the pixel electrodes on the base substrate.

2. The array substrate according to claim 1, wherein the array substrate further comprises a planar layer between the anti-reflective film and the pixel structure.

3. The array substrate according to claim 1, wherein,
    the anti-reflective film comprises a first film, and a second film disposed on a side of the first film away from the base substrate;
    the optical path control structure comprises a convex portion formed by patterning the first film and a concave portion formed by patterning the second film, and a convex surface of the convex portion and a concave surface of the concave portion fit together; and
    twice of an angle between a bottom surface and a side surface of the convex portion is larger than a critical angle of the incident light emitted from the base substrate toward air.

4. The array substrate according to claim 3, wherein the convex portion and the concave portion are part of a plurality of pyramid structures.

5. The array substrate according to claim 4, wherein each of the plurality of pyramid structures is a regular pyramid and a slope angle of each of the plurality of pyramid structures is greater than or equal to 26.6°.

6. The array substrate according to claim 3, wherein the first film comprises a silicon nitride film and the second film comprises an amorphous silicon film.

7. The array substrate according to claim 3, wherein the concave portion is configured to reflect one part of the light incident onto the concave portion through the base substrate and the convex portion back into the convex portion, and another part of the light incident onto the concave portion through the base substrate and the convex portion is absorbed, and
    wherein the total internal reflection of the one part of the light occurs at the interface between the second surface of the base substrate and air.

8. A display device, comprising an array substrate and a paired box substrate, wherein the array substrate locates on an ambient light side, wherein
    the array substrate comprises an anti-reflective substrate and a pixel structure;
    the anti-reflective substrate comprises a base substrate and an anti-reflective film disposed on a first surface of the base substrate, wherein the anti-reflective film comprises an optical path control structure, and the optical path control structure is configured so that a total internal reflection of light, that enters into the base substrate from a second surface of the base substrate opposite to the first surface and then is reflected by the optical path control structure, occurs at an interface between the second surface of the base substrate and air;
    the pixel structure is disposed on a side of the anti-reflective film away from the base substrate, and comprises a plurality of scan lines and data lines arranged in rows and columns, respectively, thin film transistors in respective regions defined by adjacent scan lines and adjacent data lines, and pixel electrodes electrically connected to the thin film transistors; and an orthographic projection of the anti-reflective film on the base substrate covers orthographic projections of the scan lines, the data lines, and the thin film transistors on the base substrate, and exposes orthographic projections of the pixel electrodes on the base substrate.

9. The display device according to claim 8, wherein the array substrate further comprises a planar layer between the anti-reflective film and the pixel structure.

10. The display device according to claim 8, wherein,
the anti-reflective film comprises a first film, and a second film disposed on a side of the first film away from the base substrate;
the optical path control structure comprises a convex portion formed by patterning the first film and a concave portion formed by patterning the second film, and a convex surface of the convex portion and a concave surface of the concave portion fit together; and
twice of an angle between a bottom surface and a side surface of the convex portion is larger than a critical angle of the incident light emitted from the base substrate toward air.

11. The display device according to claim 10, wherein the convex portion and the concave portion are part of a plurality of pyramid structures.

12. The display device according to claim 11, wherein each of the plurality of pyramid structures is a regular pyramid and a slope angle of each of the plurality of pyramid structures is greater than or equal to 26.6°.

13. The display device according to claim 10, wherein the first film comprises a silicon nitride film and the second film comprises an amorphous silicon film.

14. The display device according to claim 10, wherein the concave portion is configured to reflect one part of the light incident onto the concave portion through the base substrate and the convex portion back into the convex portion, and another part of the light incident onto the concave portion through the base substrate and the convex portion is absorbed; and wherein the total internal reflection of the one part of the light occurs at the interface between the second surface of the base substrate and air.

* * * * *